United States Patent
Kim et al.

(10) Patent No.: US 10,741,791 B2
(45) Date of Patent: Aug. 11, 2020

(54) DISPLAY APPARATUS

(71) Applicant: SAMSUNG DISPLAY CO., LTD., Yongin-si, Gyeonggi-do (KR)

(72) Inventors: Hyojin Kim, Yongin-si (KR); Yoongyeong Bae, Yongin-si (KR); Ilseob Yoon, Yongin-si (KR); Seongchae Jeong, Yongin-si (KR); Inae Han, Yongin-si (KR); Gyoowan Han, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/705,743

(22) Filed: Dec. 6, 2019

(65) Prior Publication Data

US 2020/0111994 A1 Apr. 9, 2020

Related U.S. Application Data

(63) Continuation of application No. 15/827,600, filed on Nov. 30, 2017, now Pat. No. 10,522,785.

(30) Foreign Application Priority Data

Dec. 8, 2016 (KR) .................. 10-2016-0166881

(51) Int. Cl.
*H01L 51/00* (2006.01)
*H01L 51/52* (2006.01)
*B32B 3/30* (2006.01)
*B32B 7/12* (2006.01)
*G06F 1/16* (2006.01)

(52) U.S. Cl.
CPC ............ *H01L 51/5253* (2013.01); *B32B 3/30* (2013.01); *B32B 7/12* (2013.01); *G06F 1/16* (2013.01); *H01L 51/0097* (2013.01); *G06F 1/1652* (2013.01); *H01L 2251/5338* (2013.01)

(58) Field of Classification Search
CPC ... H01L 51/5253; H01L 51/0097; B32B 3/30; B32B 7/12; G06F 1/16
USPC ....................................................... 361/749
See application file for complete search history.

(56) References Cited

U.S. PATENT DOCUMENTS

| | | | |
|---|---|---|---|
| 9,048,443 B2 | 6/2015 | Namkung et al. | |
| 9,419,065 B2 | 8/2016 | Degner et al. | |
| 2016/0014883 A1 | 1/2016 | Cho et al. | |
| 2016/0260915 A1 | 9/2016 | Park et al. | |
| 2018/0166652 A1 | 6/2018 | Kim et al. | |

FOREIGN PATENT DOCUMENTS

| | | |
|---|---|---|
| KR | 10-2014-0108914 | 9/2014 |
| KR | 10-2014-0123771 | 10/2014 |
| KR | 10-2015-0007632 | 1/2015 |
| KR | 10-2015-0036443 | 4/2015 |
| KR | 10-2015-0043604 | 4/2015 |
| KR | 10-2016-0108720 | 9/2016 |

*Primary Examiner* — Tremesha S Willis
(74) *Attorney, Agent, or Firm* — F. Chau & Associates, LLC

(57) ABSTRACT

A display apparatus includes a substrate having a bending area between a first area and a second area, wherein the substrate is bent in the bending area, a display portion on an upper surface of the substrate and positioned in the first area, and a protective film on a lower surface of the substrate and including a protective film base and an adhesive layer. The protective film base includes a plurality of cavities.

20 Claims, 5 Drawing Sheets

DISPLAY APPARATUS

CROSS-REFERENCE TO RELATED APPLICATIONS

This application is a continuation of U.S. patent application Ser. No. 15/827,600 filed on Nov. 30, 2017, which claims priority under 35 U.S.C. § 119 to Korean Patent Application No. 10-2016-0166881, filed on Dec. 8, 2016, in the Korean Intellectual Property Office, the disclosures of which are incorporated by reference herein in their entireties.

TECHNICAL FIELD

The present invention relates to a display apparatus.

DISCUSSION OF THE RELATED ART

In general, a display apparatus has a display portion arranged on a substrate. By bending at least a part of the display apparatus, the display portion may be viewed from various angles or a non-display area of the display apparatus may be reduced.

However, defects may occur in the process of manufacturing a curved display apparatus. Therefore, the lifetime of the curved display apparatus may be reduced, and the manufacturing costs thereof may increase.

SUMMARY

According to an exemplary embodiment of the present invention, a display apparatus includes a substrate having a bending area between a first area and a second area, wherein the substrate is bent in the bending area, a display portion on an upper surface of the substrate and positioned in the first area, and a protective film on a lower surface of the substrate and including a protective film base and an adhesive layer. The protective film base includes a plurality of cavities.

In an exemplary embodiment of the present invention, the protective film base includes a first surface in contact with the adhesive layer. The plurality of cavities is inside the protective film base and spaced apart from the first surface.

In an exemplary embodiment of the present invention, the protective film base includes a first surface in contact with the adhesive layer. The first surface includes a plurality of concave portions protruded toward the protective film base, and the plurality of cavities includes spaces between the plurality of concave portions and the adhesive layer.

In an exemplary embodiment of the present invention, the protective film base includes an opening corresponding to the bending area.

In an exemplary embodiment of the present invention, the protective film base includes a stress concentration area corresponding to the bending area. A thickness of the stress concentration area is less than a thickness of an area near the stress concentration area.

In an exemplary embodiment of the present invention, the protective film includes a first protective film base layer including a plurality of first cavities, and a second protective film base layer including a plurality of second cavities. The first protective film base layer is stacked on the second protective film base layer.

In an exemplary embodiment of the present invention, the adhesive layer is between the substrate and the first protective film base layer. The first protective film base layer includes a first surface in contact with the adhesive layer, and the second protective film base layer includes a second surface in contact with the first protective film base layer.

In an exemplary embodiment of the present invention, the first surface of the first protective film base layer includes a plurality of first concave portions protruded toward the first protective film base layer, and the plurality of first cavities includes spaces between the plurality of first concave portions and the adhesive layer.

In an exemplary embodiment of the present invention, the second surface of the second protective film base layer includes a plurality of second concave portions protruded toward the second protective film base layer, and the plurality of second cavities includes spaces between the plurality of second concave portions and the first protective film base layer.

In an exemplary embodiment of the present invention, the first surface of the first protective film base layer includes a plurality of first concave portions protruded toward the first protective film base layer and extending in a first direction, and the plurality of first cavities includes spaces between the plurality of first concave portions and the adhesive layer. The second surface of the second protective film base layer includes a plurality of second concave portions protruded toward the second protective film base layer and extending in a second direction, and the plurality of second cavities includes spaces between the plurality of second concave portions and the first protective film base layer.

In an exemplary embodiment of the present invention, the first direction and the second direction are different from each other.

In an exemplary embodiment of the present invention, at least one of the first protective film base layer or the second protective film base layer includes an opening corresponding to the bending area.

In an exemplary embodiment of the present invention, the display apparatus of further includes a cushion layer disposed on a portion of the protective film base corresponding to the display portion.

In an exemplary embodiment of the present invention, the cavities include air.

According to an exemplary embodiment of the present invention, a display apparatus includes a substrate, a display portion on a first surface of the substrate, and a protective film on a second surface of the substrate and including a protective film base and an adhesive layer, the protective film base includes a plurality of air cavities.

In an exemplary embodiment of the present invention, the protective film base includes a first surface in contact with the adhesive layer. The plurality of cavities is inside the protective film base and spaced apart from the first surface of the protective film base.

In an exemplary embodiment of the present invention, the protective film base includes a first surface in contact with the adhesive layer. The first surface of the protective film base includes a plurality of concave portions protruded toward the protective film base, and the plurality of cavities includes spaces between the plurality of concave portions and the adhesive layer.

In an exemplary embodiment of the present invention, the protective film base includes a first protective film base layer including a plurality of first cavities, and a second protective film base layer including a plurality of second cavities. The first protective film base layer is stacked on the second protective film base layer.

In an exemplary embodiment of the present invention, the adhesive layer is between the substrate and the first protective film base layer. The first protective film base layer includes a first surface in contact with the adhesive layer and the second protective film base layer includes a second surface in contact with the first protective film base layer. The first surface of the first protective film base layer includes a plurality of first concave portions protruded toward the first protective film base layer, and the plurality of first cavities includes spaces between the plurality of first concave portions and the adhesive layer. The second surface of the second protective film base layer includes a plurality of second concave portions protruded toward the second protective film base layer, and the plurality of second cavities includes spaces between the plurality of second concave portions and the first protective film base layer.

According to an exemplary embodiment of the present invention, a display apparatus includes a flexible substrate, a display portion on an upper surface of the substrate, and a protective film on a lower surface of the substrate and including a protective film base and an adhesive layer. The protective film base includes a plurality of cavities and a first area. A thickness of the protective film base in the first area is different from a thickness of the protective film base in a second area adjacent to the first area.

In an exemplary embodiment of the present invention, the thickness of the protective film base in the first area is less than the thickness of the protective film base in a second area.

In an exemplary embodiment of the present invention, the protective film base includes a first protective film base layer and a second protective film base layer disposed on a portion of the first protective film base layer. Only the first protective film base layer extends throughout the first area and the second area.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
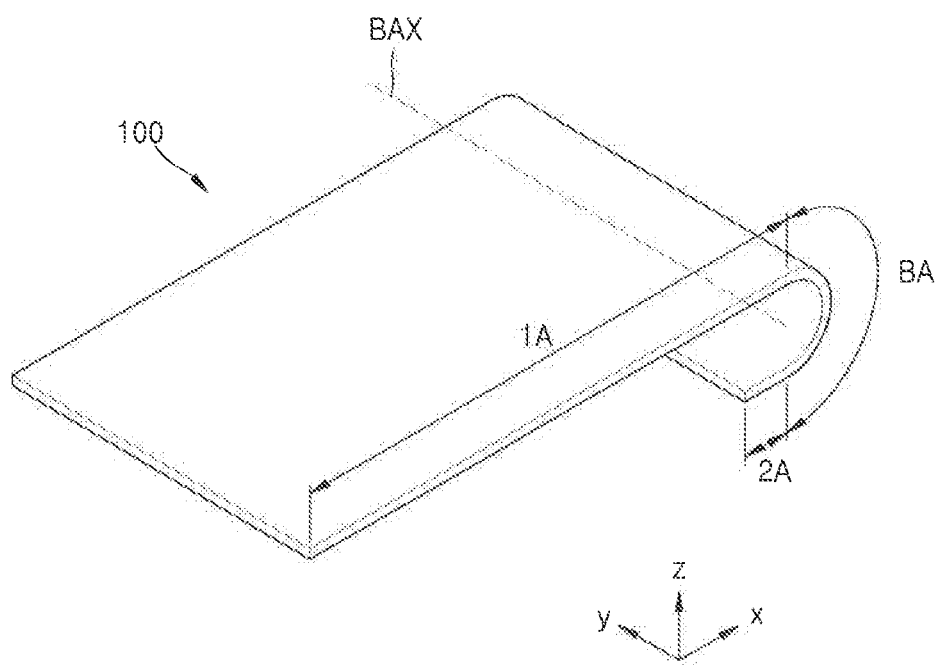
FIG. 1 is a perspective view of a portion of a display apparatus according to an exemplary embodiment of the present invention.

Hereinafter, exemplary embodiments of the present invention will be described more fully with reference to the accompanying drawings. When description is made with reference to the drawings, like reference numerals in the drawings may denote like or corresponding elements, and repeated descriptions thereof may be omitted.

As used herein, the singular forms "a" "an" and "the" are intended to include the plural forms as well, unless the context clearly indicates otherwise.

It will be understood that when a layer, region, or element is referred to as being "formed on" or "disposed on", another layer, region, or element, it can be directly on the other layer, region, or element or intervening layers, regions or elements may be present.

Sizes of elements in the drawings may be exaggerated for convenience of explanation.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

FIG. 1 is a perspective view of a portion of a display apparatus according to an exemplary embodiment of the present invention. According to the present embodiment, since a portion of a substrate 100, which is included in the display apparatus, is bent as shown in FIG. 1, a portion of the display apparatus has a bent form in a manner corresponding to the bend of the substrate 100.

As shown in FIG. 1, the substrate 100 included in the display apparatus has a bending area BA which extends in a first direction (e.g., +y direction). Along a second direction (e.g., +x direction) crossing the first direction, the bending area BA is between a first area 1A and a second area 2A. The substrate 100 is bent around a bending axis BAX which extends in the first direction (e.g., +y direction), as shown in FIG. 1. The substrate 100 may include various materials having flexible or bendable characteristics, and may include, for example, a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

Figure 2:
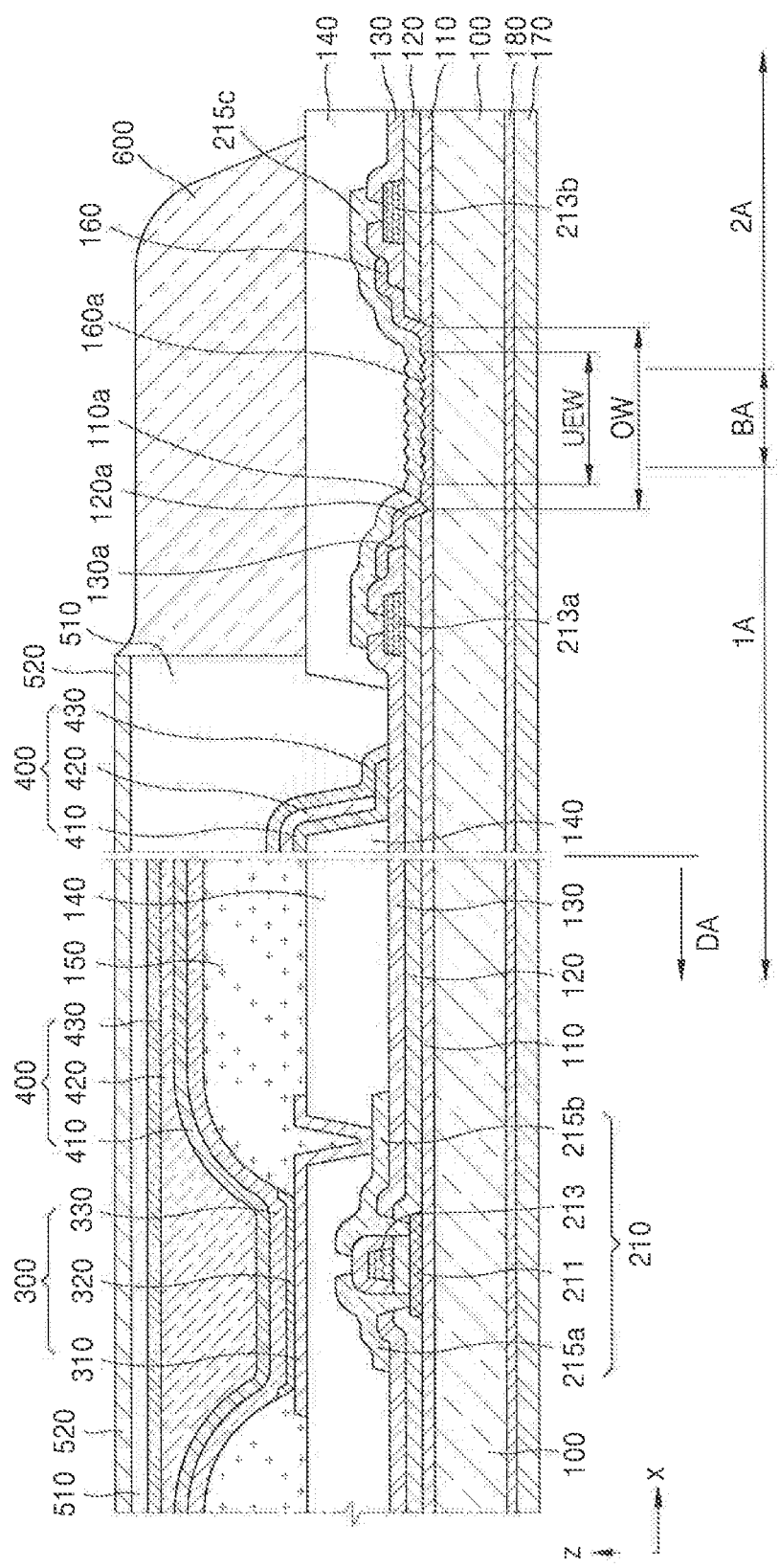
FIGS. 2 and 3 are cross-sectional views illustrating processes for manufacturing the display apparatus of FIG. 1 according to an exemplary embodiment of the present invention.
Figure 3:
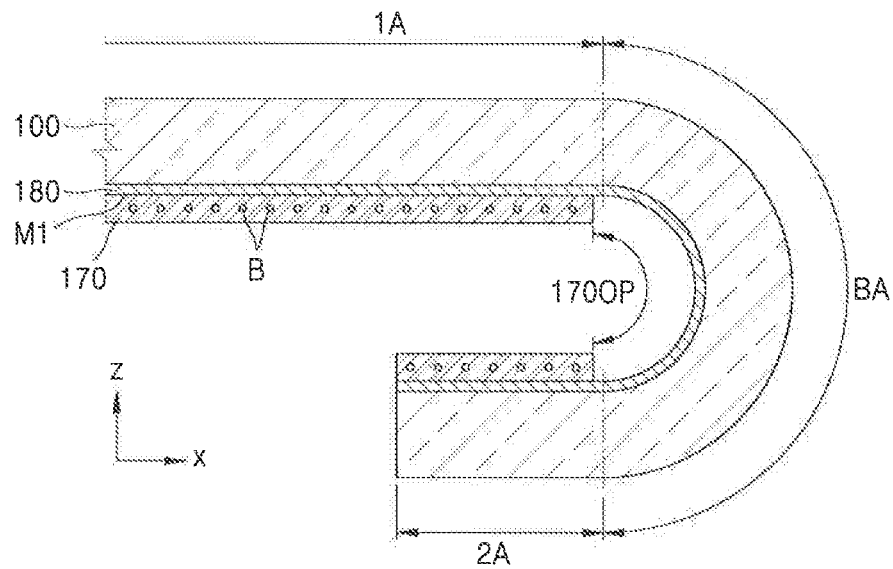

FIGS. 2 and 3 are cross-sectional views illustrating processes for manufacturing the display apparatus of FIG. 1 according to an exemplary embodiment of the present invention;

First, a display panel as shown in FIG. 2 is prepared. As shown in FIG. 2, the first area 1A of the substrate 100 includes a display area DA. In addition to the display area DA, the first area 1A includes a portion of a non-display area outside the display area DA, as shown in FIG. 2. The second area 2A includes a portion of the non-display area. In the first area 1A, a display portion including a display device, such as an organic light-emitting device 300, and a thin film transistor 210 may be arranged. The display portion may include only components arranged in the display area DA, and may also include components that correspond to the first area 1A but are arranged in the non-display area. The substrate 100 has the bending area BA between the first area 1A and the second area 2A. The substrate 100 is bent in the bending area BA to have a curved shape, as shown in FIG. 1.

The display panel includes a protective film base 170 disposed on a lower surface of the substrate 100 in a third direction (e.g., −z direction). The protective film base 170 may be attached on the lower surface of the substrate 100 by an adhesive layer 180. In other words, a protective film, which includes the protective film base 170, and the adhesive layer 180 is attached on the lower surface of the substrate 100.

A detailed structure of the display panel with the protective film attached thereon will be described with reference to FIG. 2.

In addition to the display device such as the organic light-emitting device 300, the display area DA of the display panel may include the thin film transistor 210 to which the organic light-emitting device 300 is electrically connected, as described above. In addition, a pixel electrode 310 of the organic light-emitting device 300 is electrically connected to the thin film transistor 210. A thin film transistor may also be arranged in a peripheral area outside the display area DA of the substrate 100, as needed. The thin film transistor arranged in the peripheral area may be, for example, a portion of a circuit unit for controlling an electrical signal applied to the display area DA.

The thin film transistor 210 may include a semiconductor layer 211 including amorphous silicon, polycrystalline silicon, or an organic semiconductor material, a gate electrode 213, a source electrode 215a, and a drain electrode 215b. To secure insulation between the semiconductor layer 211 and the gate electrode 213, a gate insulating layer 120 including inorganic materials such as silicon oxide, silicon nitride, and/or silicon oxynitride may be arranged between the semiconductor layer 211 and the gate electrode 213. An interlayer insulating layer 130 including inorganic materials such as silicon oxide, silicon nitride, and/or silicon oxynitride may be arranged on the gate electrode 213. The source electrode 215a and the drain electrode 215b may be arranged on the interlayer insulating layer 130. Insulating layers including inorganic materials may be formed via chemical vapor deposition (CVD) or atomic layer deposition (ALD). This forming method is also applied to exemplary embodiments of the present invention and various modifications thereof to be described below.

A buffer layer 110 may be arranged between the thin film transistor 210 and the substrate 100, as described above. The buffer layer 110 may include inorganic materials such as silicon oxide, silicon nitride, and/or silicon oxynitride. The buffer layer 110 may further flatten an upper surface of the substrate 100, or prevent or reduce infiltration of impurities from the substrate 100, etc. to the semiconductor layer 211 of the thin film transistor 210.

A planarization layer 140 may be arranged over the thin film transistor 210. For example, when the organic light-emitting device 300 is arranged on the thin film transistor 210, as shown in FIG. 2, the planarization layer 140 may substantially planarize an upper portion of the protective film covering the thin film transistor 210. The planarization layer 140 may include an organic material such as acryl, benzocyclobutene (BCB), or hexamethyldisiloxane (HMDSO). Although the planarization layer 140 is illustrated as a single-layer in FIG. 2, the planarization layer 140 may be variously modified. For example, the planarization layer 140 may have a multi-layered structure. As shown in FIG. 2, the planarization layer 140 may have an opening outside the display area DA so that a portion of the planarization layer 140 in the display area DA and a portion of the planarization layer 140 in the second area 2A are physically separated from each other. For example, the opening may correspond to the first area 1A. This separation may prevent impurities infiltrating from the outside from reaching the inside of the display area DA through the inside of the planarization layer 140.

In the display area DA, the organic light-emitting device 300 including the pixel electrode 310, an opposite electrode 330, and an intermediate layer 320 interposed therebetween and including an emission layer, may be arranged on the planarization layer 140. The pixel electrode 310 contacts any one of the source electrode 215a and the drain electrode 215b via an opening formed in the planarization layer 140, and the pixel electrode 310 may be electrically connected to the thin film transistor 210, as shown in FIG. 2.

A pixel-defining layer 150 may be arranged on the planarization layer 140. The pixel-defining layer 150 has an opening corresponding to each sub-pixel, and thus serves to form a pixel. For example, the opening exposes at least a central portion of the pixel electrode 310. In addition, as shown in FIG. 2, the pixel-defining layer 150 may prevent an occurrence of an arc, etc. on an edge of the pixel electrode 310 by increasing a distance between the edge of the pixel electrode 310 and the opposite electrode 330 above the pixel electrode 310. The pixel-defining layer 150 may include, for example, organic materials such as PI and HMDSO.

The intermediate layer 320 may include a low molecular weight material or a high molecular weight (polymer) material. When the intermediate layer 320 includes a low molecular weight material, the intermediate layer 320 may have a structure in which a hole injection layer (HIL), a hole transport layer (HTL), an emission layer (EML), an electron transport layer (ETL), an electron injection layer (EIL), etc. are stacked in a single or composite structure, and may include various organic materials such as copper phthalocyanine (CuPc), N,N'-Di(naphthalene-1-yl)-N,N'-diphenylbenzidine (NPB), and tris-8-hydroxyquinoline aluminum (Alq3). The above-described layers may be formed via a vacuum deposition method.

When the intermediate layer 320 includes a high molecular weight material, the intermediate layer 320 may have a structure which generally includes an HTL and an EML. In this case, the HTL may include poly(3,4-ethylenedioxythiophene) (PEDOT) and the EML may include a high molecular weight material such as poly-phenylenevinylene (PPV) or polyfluorene. The intermediate layer 320 may be formed via screen printing, inkjet printing, laser induced thermal imaging (LITI), etc.

The intermediate layer 320 is not limited thereto and may have various other structures. For example, the intermediate layer 320 may include an integrated layer covering a plurality of pixel electrodes 310, and may also include a patterned layer corresponding to each of the plurality of pixel electrodes 310.

The opposite electrode 330 may be arranged on a top portion of the display area DA and cover the display area DA, as illustrated in FIG. 2. In other words, the opposite electrode 330 may be integrally formed in a plurality of organic light-emitting devices 300, and thus may correspond to the plurality of pixel electrodes 310.

Since the organic light-emitting device 300 may be damaged by humidity, oxygen, or other external elements from the outside, an encapsulation layer 400 may protect the organic light-emitting device 300 by encapsulating the organic light-emitting device 300. The encapsulation layer 400 may cover the display area DA and extend to the outside of the display area DA. The encapsulation layer 400 may include a first inorganic encapsulation layer 410, an organic encapsulation layer 420, and a second inorganic encapsulation layer 430, as shown in FIG. 2.

The first inorganic encapsulation layer 410 may cover the opposite electrode 330 and may include silicon oxide, silicon nitride, and/or silicon oxynitride, etc. Other layers such as a capping layer may be arranged between the first inorganic encapsulation layer 410 and the opposite electrode 330, as needed. Since the first inorganic encapsulation layer 410 is formed along a structure thereunder, an upper surface of the first inorganic encapsulation layer 410 might not be flat, as shown in FIG. 2. The organic encapsulation layer 420 may cover the first inorganic encapsulation layer 410, and an upper surface of the organic encapsulation layer 420 may be substantially flat, unlike the first inorganic encapsulation layer 410. For example, the upper surface of the organic encapsulation layer 420 may be substantially flat in an area corresponding to the display area DA. The organic encapsulation layer 420 may include one or more of polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and may include silicon oxide, silicon nitride, and/or silicon oxynitride, etc. The second inorganic encapsulation layer 430 may prevent the organic encapsulation layer 420 from being exposed to the outside by having the second inorganic encapsulation layer 430 contact an edge arranged outside the display area DA.

Since the encapsulation layer 400 includes the first inorganic encapsulation layer 410, the organic encapsulation layer 420, and the second encapsulation layer 430, even when a crack forms in the encapsulation layer 400 through the multi-layered structure, the crack might not be connected between the first inorganic encapsulation layer 410 and the organic encapsulation layer 420 or between the organic encapsulation layer 420 and the second encapsulation layer 430. Thus, it may be possible to prevent or minimize the formation of a route, by means of a crack, through which humidity, oxygen or other impurities from the outside may penetrate into the display area DA.

If necessary, a process of forming, on the encapsulation layer 400, a touch electrode having various patterns for a touch screen function or a touch protection layer for protecting the touch electrode may be further performed.

The display panel includes the protective film base 170 disposed on the lower surface of the substrate 100 in the third direction (e.g., −z direction). The protective film base 170 included in the protective film may include polyethylene terephthalate (PET) or polyimide (PI). As described above, the protective film base 170 may be attached on the lower surface of the substrate 100 by the adhesive layer 180. The adhesive layer 180 included in the protective film may include, for example, a pressure sensitive adhesive (PSA). The time for attaching the protective film to the lower surface of the substrate 100 may vary depending on the situation.

For example, when a plurality of display portions is formed on a single mother substrate, a rigid carder substrate may be positioned under the mother substrate to facilitate handling of the mother substrate having flexible or bendable characteristics during manufacturing processes. In a state in which the mother substrate is supported by the carrier substrate, a plurality of display portions and encapsulation layers 400 for encapsulating the plurality of display portions are formed on the mother substrate. Each of the plurality of display portions includes a display device such as the organic light-emitting device 300, the thin film transistor 210, and the like, as described above. After the plurality of display portions are formed on the mother substrate, the carrier substrate may be separated from the mother substrate. In addition, after a touch electrode and/or a touch protection layer for protecting the touch electrode are also formed on the encapsulation layers 400, the carrier substrate may be separated from the mother substrate. In this case, the carrier substrate may be separated from the mother substrate through, for example, a physical or laser method. In any case, after the carrier substrate is separated from the mother substrate, a protective film including the protective film base 170 and the adhesive layer 180 may be attached on a surface of the mother substrate in the direction of the carrier substrate, and then a plurality of display panels may be obtained by cutting the mother substrate and the protective film. The plurality of display panels may be obtained from the mother substrate through a physical cutting method using a tool such as a blade, or a laser cutting method. The substrate 100 may be understood as a state in which the mother substrate is cut in such a manner previously described.

After the mother substrate and the protective film are cut to obtain a plurality of display panels, a polarizing plate 520 may be attached on the encapsulation layer 400 by an optically clear adhesive (OCA) 510, and a printed circuit board, an electronic chip, or the like may be attached to the second area 2A, as needed. If an element such as a touch electrode or a touch protection layer is on the encapsulation layer 400, the OCA 510 and the polarizing plate 520 are positioned on the element. In addition, a bending protection layer (BPL) 600 may be formed outside the display area DA. For example, the bending protection layer 600 may be formed on the planarization layer 140.

One display portion may be formed on one substrate 100 without simultaneously obtaining a plurality of display panels by using a mother substrate. Also in this case, a rigid carrier substrate may be placed under the substrate 100 to facilitate handling of the substrate 100 having flexible or bendable characteristics during manufacturing processes. After a display portion and the encapsulation layers 400 for encapsulating the display portion are formed on the substrate 100, a carrier substrate may be separated from the substrate 100. In addition, after a touch electrode and/or a touch protection layer for protecting the touch electrode are also formed on the encapsulation layers 400, the carrier substrate may be separated from the substrate 100. In any case, after the carrier substrate is separated from the substrate 100, a protective film including the protective film base 170 and the adhesive layer 180 may be attached on a surface of the substrate 100. Then, the polarizing plate 520 may be attached on the encapsulation layer 400 or the touch protection layer by the OCA 510, and if necessary, a printed circuit board, an electronic chip, or the like may be attached to the second area 2A. In addition, the bending protection layer 600 may be formed outside the display area DA.

The polarizing plate 520 may reduce external light reflection. For example, when external light passes through the polarizing plate 520 and then passes through the polarizing plate 520 again after being reflected from an upper surface of the opposite electrode 330, the phase of the external light may be changed as the external light passes through the polarizing plate 520 twice. As a result, the phase of the reflected light becomes different from the phase of the external light entering the polarizing plate 520, so that destructive interference is generated, and consequently, visibility may be increased by the reduction of external light reflection. The OCA 510 and the polarizing plate 520 may be positioned to cover an opening of the planarization layer 140, for example, as shown in FIG. 2.

When manufacturing the display apparatus according to the present embodiment, an operation of forming the polarizing plate 520 is not always required, and other configurations other than the polarizing plate 520 may be used. For example, a black matrix and a color filter may be formed without attaching the polarizing plate 520, thereby reducing external light reflection in a display apparatus completed later.

The bending protection layer 600 may be positioned on a first conductive layer 215c to correspond to at least the bending area BA. For example, the bending protection layer 600 may overlap the bending area BA. When a stack structure is bent, a stress neutral plane exists in the stack structure. For example, if the bending protection layer 600 is not disposed in the display apparatus, an excessive tensile stress may be applied to the first conductive layer 215c in the bending area BA in accordance with bending of the substrate 100 or the like, as described later. This excessive tensile stress may be applied because the position of the first conductive layer 215c might not correspond to the stress neutral plane. However, by forming the bending protection layer 600 and adjusting the thickness and modulus of the bending protection layer 600, the position of the stress neutral plane may be adjusted in a stack structure including the substrate 100, the first conductive layer 215c, and the bending protection layer 600. By adjusting the thickness and the modulus of the bending protection layer 600, the position of the plane may be adjusted. Therefore, by placing the stress neutral plane in the vicinity of the first conductive layer 215c through the bending protection layer 600, a tensile stress applied to the first conductive layer 215c may be reduced to protect a bending portion.

The bending protection layer 600 may extend to the edge of the substrate 100 of the display apparatus, as shown in FIG. 2. For example, the first conductive layer 215c, a second conductive layer 213b, and/or other conductive layers electrically connected to the first and second conductive layers 215c and 213b in the second area 2A might not be covered, at least partially, by the interlayer insulating layer 130 or the planarization layer 140, and may be electrically connected to various electronic elements, a printed circuit board, or the like. Accordingly, a portion of the display apparatus (e.g., an electrically connected portion), in which the first conductive layer 215c, the second conductive layer 213b, and/or other conductive layers electrically connected to the first and second conductive layers 215c and 213b are electrically connected to various electronic elements, a printed circuit board, or the like, is present. In this case, it may be useful to protect the electrically connected portion from impurities such as moisture from the outside, and the bending protection layer 600 may extend to cover the electrically connected portion. Thus, by allowing the bending protection layer 600 to cover the electrically connected portion, the bending protection layer 600 may also serve as a protective layer. In addition, the bending protection layer 600 may extend to the edge of the substrate 100 of the display apparatus.

FIG. 2 shows that an upper surface of the bending protection layer 600 in, for example, a negative second direction (e.g., -x direction) of the display area DA is aligned with an upper surface of the polarizing plate 520. However, the present invention is not limited thereto. For example, an end portion of the bending protection layer 600 in the negative second direction (e.g., -x direction) of the display area DA may cover a portion of an upper surface of an edge portion of the polarizing plate 520. In addition, the end portion of the bending protection layer 600 in the negative second direction (e.g., -x direction) of the display area DA might not be in contact with the polarizing plate 520 and/or the OCA 510.

After the protective film including the protective film base 170 and the adhesive layer 180 is attached on the lower surface of the substrate 100, a laser beam is radiated to at least a portion of the protective film base 170 corresponding to the bending area BA so that the protective film base 170 has an opening 170OP corresponding to the bending area BA, as shown in FIG. 3.

A method of removing a portion of the protective film base 170 included in the protective film to form the opening 170OP is not limited thereto. For example, at least a portion of the protective film base 170 may be precut at the boundary between a portion to be removed and a portion not to be removed of the protective film base 170 before the protective film is attached to the lower surface of the substrate 100. Here, the portion of the protective film base 170 to be removed may be understood as a portion of the protective film base 170 corresponding to the bending area BA when the protective film is attached to the lower surface of the substrate 100. After the protective film is attached to the lower surface of the substrate 100, the portion of the protective film base 170 corresponding to the bending area BA may be removed. In this case, to remove the portion of the protective film base 170 corresponding to the bending area BA, an adhesive strength of a portion of the adhesive layer 180 corresponding to the portion of the protective film base 170 corresponding to the bending area BA may be weaker than an adhesive strength of the other portions of the adhesive layer 180. In other words, the adhesive strength of the portion of the adhesive layer 180 corresponding to the bending area BA may be lower than the adhesive strength of the other portions of the adhesive layer 180.

FIG. 3 is a cross-sectional view illustrating a portion of the display apparatus of FIG. 1, specifically, the substrate 100 and the protective film. As shown in FIG. 3, the substrate 100 may be bent in the bending area BA. The protective film base 170 of the protective film may protect the lower surface of the substrate 100, and may have its own rigidity. Accordingly, when the flexibility of the protective film base 170 is low, desquamation may occur between the protective film base 170 and the substrate 100 as the substrate 100 is bent. However, in the case of the display apparatus according to the present embodiment, since the protective film base 170 has the opening 170OP corresponding to the bending area BA, it is possible to prevent the occurrence of the desquamation.

In FIG. 3, the edge of the substrate 100 in the second area 2A is shown as coinciding with the end of the protective film. However, the present invention is not limited thereto. For example, the ends of the protective film base 170 and the adhesive layer 180 may not extend to the edge of the substrate 100 and may not cover a lower surface of the substrate 100 in the vicinity of the edge thereof. In addition, in FIG. 3, an end surface (e.g., a side surface) of the protective film base 170 is shown as being substantially perpendicular to the lower surface of the substrate 100. However, the end surface of the protective film base 170 may be inclined at an angle not perpendicular to the lower surface of the substrate 100.

The buffer layer 110, the gate insulating layer 120, and the interlayer insulating layer 130, which include an inorganic material, shown in FIG. 2 may be collectively referred to as an inorganic insulating layer. The inorganic insulating layer has an opening corresponding to the bending area BA, as shown in FIG. 2. In other words, the buffer layer 110, the gate insulating layer 120, and the interlayer insulating layer 130 may have respectively openings 110a, 120a, and 130a corresponding to the bending area BA. For example, that an opening corresponds to the bending area BA may be understood as that the opening overlaps the bending area BA. In this case, the area of the opening (e.g. 110a, 120a, and 130a) may be larger than the area of the bending area BA. To this end, in FIG. 2, a width OW of the opening is shown to be greater than the width of the bending area BA. In this case, the area of the opening may be the area of the smallest one of the openings 110a, 120a, and 130a of the buffer layer 110, the gate insulating layer 120, and the interlayer insulating layer 130. In FIG. 2, for example, the area of the opening is the area of the opening 110a of the buffer layer 110.

In FIG. 2, the inner surface of the opening 110a of the buffer layer 110 coincides with the inner surface of the opening 120a of the gate insulating layer 120. However, the present invention is not limited thereto. For example, the area of the opening 120a of the gate insulating layer 120 may be larger than the area of the opening 110a of the buffer layer 110. In addition, in this case, the area of the opening may be the area of the smallest one of the openings 110a, 120a, and 130a of the buffer layer 110, the gate insulating layer 120, and the interlayer insulating layer 130.

When forming the display portion as described above, an organic material layer 160 filling at least a portion of an opening of the inorganic insulating layer is formed. In FIG. 2, the organic material layer 160 is shown as filling the opening. The display portion includes the first conductive layer 215c, and the first conductive layer 215c may extend from the first area 1A to the second area 2A through the bending area BA and may be positioned on the organic material layer 160. In an area where the organic material layer 160 is not present, the first conductive layer 215c may be positioned on the inorganic insulating layer such as the interlayer insulating layer 130. The first conductive layer 215c may include the same material as the source electrode 215a and the drain electrode 215b and may be formed simultaneously with the source electrode 215a and the drain electrode 215b.

As described above, after the opening 170OP is formed in the protective film base 170, the display panel is bent in the bending area BA, as shown in FIG. 3. In this case, a tensile stress may be applied to the first conductive layer 215c while the substrate 100 is bent in the bending area BA. However, in the case of the display apparatus according to the present embodiment, it is possible to prevent or reduce the occurrence of defects at the first conductive layer 215c during a bending process.

If the inorganic insulating layer such as the buffer layer 110, the gate insulating layer 120 and/or the interlayer insulating layer 130 does not have an opening in the bending area BA and has a continuous shape from the first area 1A to the second area 2A and the first conductive layer 215c is positioned on the inorganic insulating layer, a high tensile stress is applied to the first conductive layer 215c in the process of bending the substrate 100 or the like. For example, since the inorganic insulating layer has a higher hardness than an organic material layer, the inorganic insulating layer has a high probability of cracking in the bending area BA. When a crack occurs in the inorganic insulating layer, a crack may also occur in the first conductive layer 215c on the inorganic insulating layer, and thus, the probability of the occurrence of defects such as disconnection of the first conductive layer 215c may be extremely high.

However, as described above, in the display apparatus according to the present embodiment, the inorganic insulating layer has an opening in the bending area BA, and a portion of the first conductive layer 215c in the bending area BA is positioned on the organic material layer 160 filling at least a portion of an opening of the inorganic insulating layer. Since the inorganic insulating layer has an opening in the bending area BA, the probability of the occurrence of a crack in the inorganic insulating layer is extremely low. In the case of the organic material layer 160 being positioned in the opening of the inorganic insulating layer, the probability of the occurrence of a crack is low due to characteristics of an organic material included in the organic material layer 160. Therefore, it is possible to prevent the occurrence of a crack or reduce the probability of the occurrence of a crack in the bending area BA of the first conductive layer 215c positioned on the organic material layer 160. Since the hardness of the organic material layer 160 is lower than that of an inorganic material layer (e.g., the inorganic insulating layer), a tensile stress generated by the bending of the substrate 100 may be absorbed by the organic material layer 160, and thus, it is possible to effectively minimize concentration of a tensile stress on the first conductive layer 215c.

The inorganic insulating layer might not have an opening. For example, among components of the inorganic insulating layer, the buffer layer 110 is integrally formed over the first area 1A, the bending area BA, and the second area 2A without an opening, and only the gate insulating layer 120 and the interlayer insulating layer 130 may have the opening 120a and the opening 130a, respectively. In this case, it may be understood that the inorganic insulating layer does not have an opening but has a groove extending to a surface of the buffer layer 110, and it may be understood that the organic material layer 160 described above is positioned to fill a groove in the inorganic insulating layer.

When forming the display portion, second conductive layers 213a and 213b may be formed in addition to the first conductive layer 215c. The second conductive layers 213a and 213b may be formed in the first area 1A or the second area 2A so as to be positioned in a layer different from a layer in which the first conductive layer 215c is positioned, and may be electrically connected to the first conductive layer 215c. In FIG. 2, the second conductive layers 213a and 213b is shown as being formed in the same layer as the gate electrode 213 of the thin film transistor 210. In other words, the second conductive layers 213a and 213b may be formed on the gate insulating layer 120, by using the same material as the gate electrode 213 of the thin film transistor 210. In addition, the first conductive layer 215c is shown as being in contact with the second conductive layers 213a and 213b through contact holes formed in the interlayer insulating layer 130. The second conductive layer 213a is shown as being positioned in the first area 1A, and the second conductive layer 213b is shown as being positioned in the second area 2A.

The second conductive layer 213a positioned in the first area 1A may be electrically connected to a thin film transistor and the like in the display area DA, and accordingly, the first conductive layer 215c may be electrically connected to the thin film transistor or the like in the display area DA through the second conductive layer 213a. The second conductive layer 213b positioned in the second area 2A may also be electrically connected to a thin film transistor and the like in the display area DA by the first conductive layer 215c. In this manner, the second conductive layers 213a and 213b may be electrically connected to components positioned in the display area DA while being positioned outside the display area DA, or the second conductive layers 213a and 213b may extend in the direction of the display area DA while being positioned outside the display area DA, so that at least a portion of each of the second conductive layers 213a and 213b may be positioned in the display area DA.

As described above, after the opening 170OP is formed in the protective film base 170, the display panel may be bent in the bending area BA, as shown in FIG. 3. In this case, a tensile stress may be applied to components positioned in the bending area BA while the substrate 100 is bent in the bending area BA.

Therefore, when the first conductive layer 215c traversing the bending area BA is formed to include a material having a high elongation, the occurrence of a crack in the first conductive layer 215c and defects such as disconnection of the first conductive layer 215c may be prevented. In addition, in the first area 1A or the second area 2A, the second conductive layers 213a and 213b may be formed of a material having an elongation lower than that of the first conductive layer 215c but having an electrical/physical characteristic different from that of the first conductive layer 215c. Thus, the efficiency of electrical signal transmission in the display apparatus may be increased, or the rate of failure occurrence in a manufacturing process for the display apparatus may be reduced. For example, the second conductive layers 213a and 213b may include molybdenum, and the first conductive layer 215c may include aluminum. The first conductive layer 215c or the second conductive layers 213a and 213b may have a multilayered structure.

In the case of the second conductive layer 213b positioned in the second area 2A, at least a portion of the upper surface of the second conductive layer 213b may be exposed to the outside without being covered with the planarization layer 140, and thus, may be electrically connected to various electronic elements or a printed circuit board.

As shown in FIG. 2, the organic material layer 160 may have an uneven surface 160a in at least a portion of the upper surface thereof (e.g., in the +z direction). For example, the uneven surface 160a may have grooves or a wave-like shape. Since the organic material layer 160 has the uneven surface 160a, the upper surface and/or the lower surface of the first conductive layer 215c positioned on the organic material layer 160 may have a shape corresponding to the uneven surface 160a of the organic material layer 160.

As described above, a tensile stress may be applied to the first conductive layer 215c when the substrate 100 is bent in the bending area BA in a manufacturing process, and, the amount of the tensile stress applied to the first conductive layer 215c may be reduced by making the upper surface and/or the lower surface of the first conductive layer 215c have a shape corresponding to the uneven surface 160a of the organic material layer 160. In other words, a tensile stress that may occur in the bending process may be reduced through the deformation of the shape of the organic material layer 160 having a low rigidity. In this case, by deforming the shape of the first conductive layer 215c, which has an uneven shape at least before bending, so as to correspond to the shape of the organic material layer 160 deformed by bending, the occurrence of defects such as disconnection in the first conductive layer 215c may be effectively prevented.

In addition, by forming the uneven surface 160a in at least a portion of the upper surface (e.g., in the +z direction) of the organic material layer 160, a surface area of the upper surface of the organic material layer 160 and a surface area of the upper and lower surface of the first conductive layer 215c may be increased. For example, in an opening, the surface area of the upper surface of the organic material layer 160 and the surface area of the upper and lower surface of the first conductive layer 215c may be increased. Large surface areas of the upper surface of the organic material layer 160 and the upper and lower surface of the first conductive layer 215c provide a large margin for deforming the shape of the substrate 100 to reduce a tensile stress occurring due to bending of the substrate 100.

Since the first conductive layer 215c is positioned on the organic material layer 160, the lower surface of the first conductive layer 215c has a shape corresponding to the uneven surface 160a of the organic material layer 160. In addition, the upper surface of the first conductive layer 215c may have an uneven surface having a unique shape that does not correspond to the uneven surface 160a of the organic material layer 160. For example, the uneven surface of the first conductive layer 215c may have grooves that do not correspond to grooves of the uneven surface 160a of the organic material layer 160. However, the present invention is not limited thereto.

The uneven surface 160a of the upper surface of the organic material layer 160 may be formed by various methods. For example, in the case of forming the organic material layer 160, particular portions thereof may be etched more than the other portions by varying the amount of exposure of various portions of the organic material layer 160, of which the upper surface is still flat in the manufacturing process, by using a photoresist material and a slit or halftone mask. In this case, more etched portions may be understood as concave portions in the upper surface of the organic material layer 160. A method of forming the uneven surface 160a is not limited to the method described above. For example, various methods, such as dry-etching and removing only specific portions of the organic material layer 160 after the organic material layer 160 having a substantially flat upper surface is formed, may be used.

To make the organic material layer 160 have the uneven surface 160a in the upper surface, the upper surface of the organic material layer 160 may have a plurality of grooves extending in the first direction (e.g., +y direction). In this case, the shape of the upper surface of the first conductive layer 215c positioned on the organic material layer 160 corresponds to the shape of the upper surface of the organic material layer 160. For example, the upper surface of the first conductive layer 215c may have a plurality of grooves extending in the first direction.

The organic material layer 160 may have the uneven surface 160a only in an opening of the inorganic insulating layer. In FIG. 2, a width UEW of a portion of the opening of the inorganic insulating layer in which the uneven surface 160a of the organic material layer 160 is formed is shown as being less than a width OW of the opening of the inorganic insulating layer. If the organic material layer 160 has an uneven surface 160a inside and outside the opening of the inorganic insulating layer, the organic material layer 160 has the uneven surface 160a near an inside surface of the opening 110a of the buffer layer 110, an inside surface of the opening 120a of the gate insulating layer 120, or an inside surface of the opening 130a of the interlayer insulating layer 130. The organic material layer 160 is relatively thinner in a concave portion of the uneven surface 160a than in a protruding portion, and thus, when the concave portion is positioned near the inside surface of the opening 110a of the buffer layer 110, the inside surface of the opening 120a of the gate insulating layer 120, or the inside surface of the opening 130a of the interlayer insulating layer 130, the organic material layer 160 may be disconnected without being continuously connected. Accordingly, the organic material layer 160 may have the uneven surface 160a only in the opening of the inorganic insulating layer so that the organic material layer 160 is prevented from being disconnected near the inner surface of the opening 110a of the buffer layer 110, the inner surface of the opening 120a of the gate insulating layer 120, or the inside surface of the opening 130a of the interlayer insulating layer 130. In other words, the uneven surface 160a of the organic material layer 160 may have a width substantially equal to the width UEW.

To prevent disconnection of the first conductive layer 215c in the bending area BA, as described above, the organic material layer 160 may have an uneven surface 160a in the bending area BA. As a result, the area of a portion having the uneven surface 160a in the organic material layer 160 may be larger than the area of the bending area BA but smaller than the area of the opening. In FIG. 2, the width UEW of the portion having the uneven surface 160a is shown as being greater than the width of the bending area BA and less than the width OW of the opening.

If at least one of the buffer layer 110, the gate insulating layer 120, and the interlayer insulating layer 130 includes an organic insulating material, the organic material layer 160 may be formed simultaneously with the at least one layer including the organic insulating material. Furthermore, the at least one layer including the organic insulating material and the organic material layer 160 may be integrally formed with each other. Examples of the organic insulating material include polyethylene terephthalate, polyethylene naphthalate, polycarbonate, polyimide, polyethylene sulfonate, polyoxymethylene, polyarylate, and hexamethyldisiloxane.

Most of the configurations described with reference to FIG. 2 may be applied to exemplary embodiments of the present invention and modifications to be described later.

As described above, the protective film including the protective film base 170 and the adhesive layer 180 may be attached on the lower surface of the substrate 100. In this case, the protective film base 170 may include a plurality of cavities B. The protective film base 170 included in the protective film may include polyethyleneterephthalate (PET) or polyimide (PI). The plurality of cavities B included in the protective film base 170 are spaces for trapping air by bubbles having a predetermined size or more, formed inside the protective film base 170. The sizes of the plurality of cavities B may be determined depending on the thickness of the protective film base 170. In an exemplary embodiment of the present invention, when the protective film base 170 has a thickness of about 70 um to about 80 um, each of the plurality of cavities B may have a diameter of about 1 um to about 75 um. However, this is only an example, and the sizes of the plurality of cavities B may be changed depending on the thickness of the protective film base 170. When the sizes of the plurality of cavities B are less than 1 um, it may not be possible to obtain a sufficient external shock mitigation effect. In FIG. 3, a plurality of cavities B may be arranged in one row in the protective film base 170 as shown, but the present disclosure is not limited thereto. The plurality of cavities B may be arranged in one row as in FIG. 3, or may be arranged in a plurality of rows. In an exemplary embodiment of the present invention, the plurality of cavities B may be irregularly arranged inside the protective film base 170. For example, the plurality of cavities B may have a staggered arrangement inside of the protective film base 170. As the protective film base 170 includes the plurality of cavities B for trapping air, the protective film base 170 may mitigate an impact that may occur in the process of manufacturing the display apparatus. The plurality of cavities B may provide a force buffering effect to disperse an external impact, transmitted in one direction through a space for trapping air, in various directions.

The protective film base 170 may include a first surface M1 in contact with the adhesive layer 180, and the plurality of cavities B may be arranged in the inside of the protective film base spaced apart from the first surface M1. The plurality of cavities B may be formed by radiating a laser beam to the protective film base 170 before the protective film is attached to the lower surface of the substrate 100. The plurality of cavities B may be formed through heat generated from the laser beam radiated to the protective film base 170. The shapes of the plurality of cavities B may be determined depending on the type and settings of laser. The plurality of cavities B may be substantially circular, but may be formed in a shape different from the circular shape by using a laser. The laser may be a femto-second IR laser or a pico-second IR laser. In an exemplary embodiment of the present invention, the plurality of cavities B may be formed in the inside spaced apart from the first surface M1 by positioning a spot of a laser inside the protective film base 170 and radiating a laser beam. In an exemplary embodiment of the present invention, the plurality of cavities B may be formed by attaching the protective film to the lower surface of the substrate 100 and then radiating a laser beam to the protective film base 170. In an exemplary embodiment of the present invention, the plurality of cavities B may be formed in the protective film base 170 by using a foaming process when the protective film is manufactured. In this case, the plurality of cavities B may be irregularly formed inside the protective film base 170.

As described above, the display apparatus according to the present embodiment may mitigate an external impact, which may occur in the manufacture of a display apparatus having a bent portion, through a protective film including a plurality of cavities B.

FIGS. 4 to 8 are cross-sectional views illustrating cross-sectional views of the display apparatus of FIG. 1 according to an exemplary embodiment of the present invention.

Figure 4:
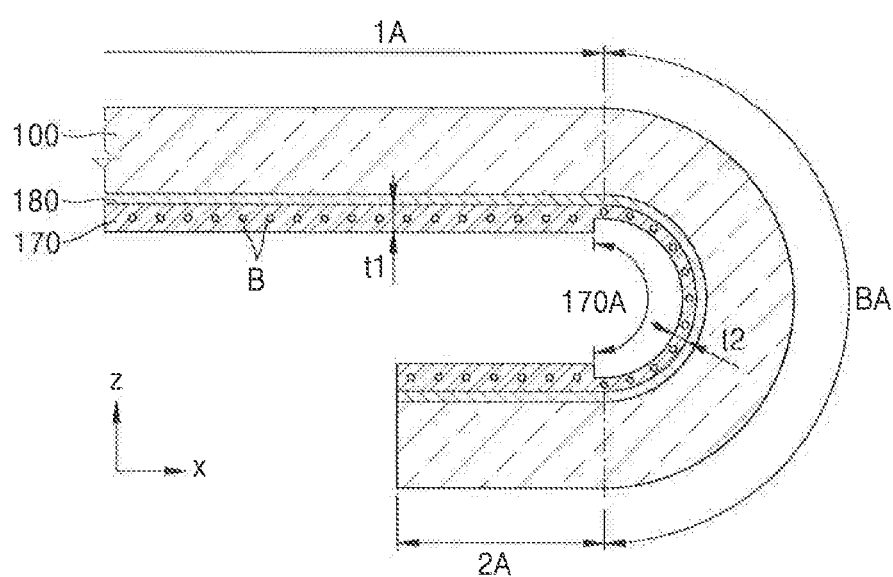
FIGS. 4 to 8 are cross-sectional views illustrating cross-sectional views of the display apparatus of FIG. 1 according to an exemplary embodiment of the present invention.

Referring to FIG. 4, a protective film base 170 may include a plurality of cavities B for trapping air. In this case, the protective film base 170 may have a stress concentration area 170A corresponding to the bending area BA. Although FIG. 3 shows a case where the protective film base 170 includes an opening 170OP corresponding to the bending area BA, the present disclosure is not limited thereto. As in FIG. 4, the protective film base 170 may include the stress concentration area 170A corresponding to the bending area BA. The protective film base 170 may include a plurality of cavities B in the stress concentration area 170A as well as in a peripheral area corresponding to a first area 1A and a second area 2A. When the display apparatus is bent, a tensile stress may be applied to the bending area BA. Although the opening 170OP may be formed in the protective film base 170 to reduce the tensile stress, as shown in FIG. 3, exemplary embodiments of the present invention may include a plurality of cavities B also in the stress concentration area 170A to reduce the tensile stress. The plurality of cavities B are spaces for trapping air therein, and may absorb stress generated during bending or disperse the direction of a force, thereby reducing the tensile stress. A thickness t2 of the protective film base 170 in the stress concentration area 170A may be less than a thickness t1 of the protective film base 170 in a peripheral area around the stress concentration area 170A. As the thickness t2 of the protective film base 170 in the stress concentration area 170A is less than the thickness t1 of the protective film base 170 in the peripheral area, the protective film base 170 may reduce the tensile stress.

In an alternative embodiment of the present invention, in the stress concentration area 170A of the protective film base 170, there may be a plurality of openings.

In FIG. 4, a plurality of cavities B arranged in the stress concentration area 170A and a plurality of cavities B arranged in the peripheral area around the stress concentration area 170A are shown to have substantially the same size and shape. However, the present invention is not limited thereto, and the plurality of cavities B arranged in the stress concentration area 170A may have different sizes and/or shapes from the plurality of cavities B arranged in the peripheral area. For example, since the protective film base 170 in the stress concentration area 170A has a smaller thickness than that of in the peripheral area, the plurality of cavities B arranged in the stress concentration area 170A may be smaller in size than the plurality of cavities B arranged in the peripheral area. In addition, the plurality of cavities B arranged in the peripheral area are arranged in a plurality of rows, whereas a plurality of cavities B arranged in the stress concentration area 170A may be arranged in a single column.

Figure 5:
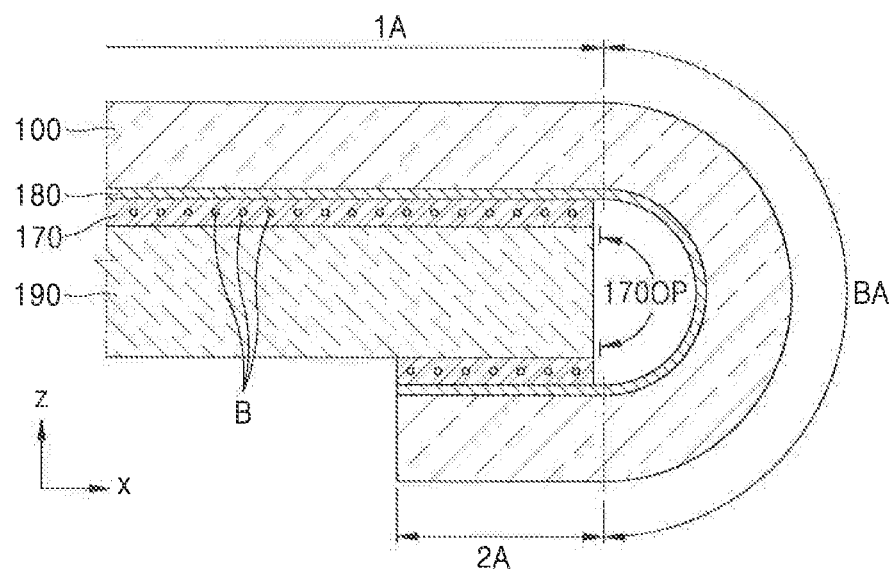

Referring to FIG. 5, in a display apparatus according to an exemplary embodiment of the present invention, after a substrate 100 is bent, a cushion layer 190 may be arranged in an area where a first area 1A and a second area 2A face each other. In other words, the cushion layer 190 may be disposed where it contacts a portion of the protective film base 170 in the first area 1A and a portion of the protective film base 170 in the second area 2A. The cushion layer 190 may support a display panel, arranged in a space in which the first area 1A and the second area 2A are spaced apart from each other after the substrate 100 is bent, and may absorb an impact. The cushion layer 190 may include a material having elasticity.

In an alternative embodiment of the present invention, the cushion layer 190 may be disposed on at least a portion of the protective film base 170 that corresponds to the display area DA.

A filler may be further arranged in an opening portion 170OP of a protective film. The filler may be formed by injecting a liquid or paste material into the opening 170OP of the protective film and curing the liquid or paste material. To cure the filler, a method of radiating ultraviolet rays (UV) or applying heat may be used. The filler may include a material having adhesion properties, and may prevent or reduce deformation of the substrate 100 due to a restoring force for restoring the substrate 100 to a state before the bending of the substrate 100 as the filler is cured by UV or heat. The cushion layer 190 and/or the filler may be omitted or only one of them may be used.

Figure 6:
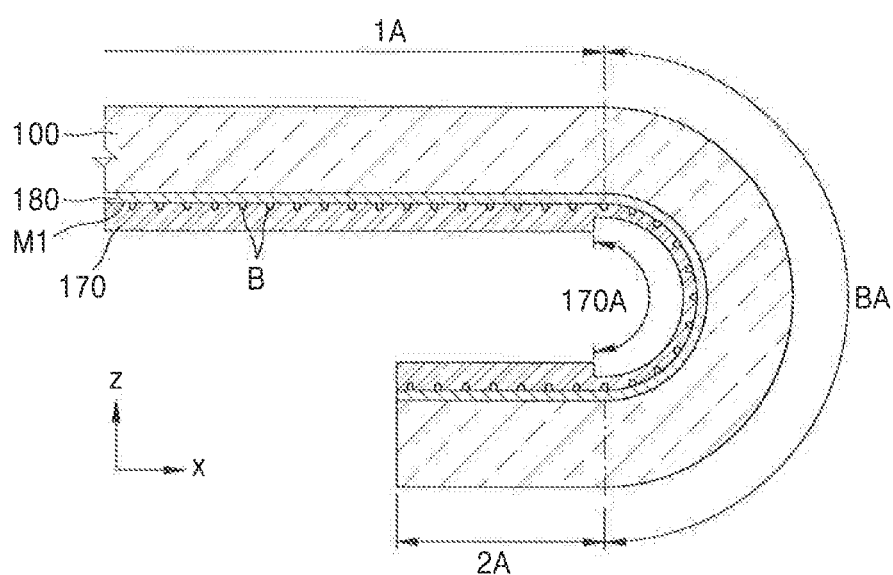

Referring to FIG. 6, a plurality of cavities B may be formed on one side of a protective film base 170. In other words, the protective film base 170 may include a first surface M1 in contact with an adhesive layer 180, and the first surface M1 may include a plurality of concave portions concaved in the direction of the protective film base 170. In this case, the plurality of cavities B may be spaces between the plurality of concave portions and an adhesive layer 180. In FIG. 6, a laser beam may be radiated to the first surface M1 of the protective film base 170 to form the plurality of cavities B. A laser for radiating the laser beam may be a femto-second IR laser or a pico-second IR laser, as described above. The plurality of concave portions may be formed by radiating a laser beam to the first surface M1 of the protective film base 170, and in this case, the plurality of concave portions may be concavely formed in the direction of the protective film base 170 by using a radiated laser heat. And then, the plurality of cavities B may be formed in the protective film base 170 by stacking the adhesive layer 180 on the first surface M1 of the protective film base 170 to form a protective film.

FIG. 6 shows a case where the protective film base 170 includes a stress concentration area 170A corresponding to a bending area BA. In FIG. 6, the sizes and shapes of the plurality of cavities B arranged in the stress concentration area 170A are the same as those of a plurality of cavities B arranged in a peripheral area. However, the present invention is not limited thereto. The sizes and/or shapes of the plurality of cavities B arranged in the stress concentration area 170A may be different from the sizes and/or shapes of the plurality of cavities B arranged in the peripheral area. For example, the sizes of the plurality of cavities B arranged in the stress concentration area 170A may be smaller than the sizes of the plurality of cavities B arranged in the peripheral area. In addition, cavities B formed as spaces between a plurality of concave portions of the protective film base 170 and the adhesive layer 180 may be arranged in the stress concentration area 170A, and the peripheral area may include circular cavities B formed therein as well as cavities B formed as spaces between the plurality of concave portions of the protective film base 170 and the adhesive layer 180.

In an alternative embodiment of the present invention, the protective film base 170 may include the plurality of cavities B having a first shape and a plurality of second cavities having a second shape different from the first shape. For example, the plurality of cavities B may be concave from the first surface M1 of the protective film base 170, and the plurality of second cavities may have a circular shape. The plurality of second cavities may be spaced between the plurality of cavities B and apart from the first surface M1 of the protective film base 170.

Figure 7:
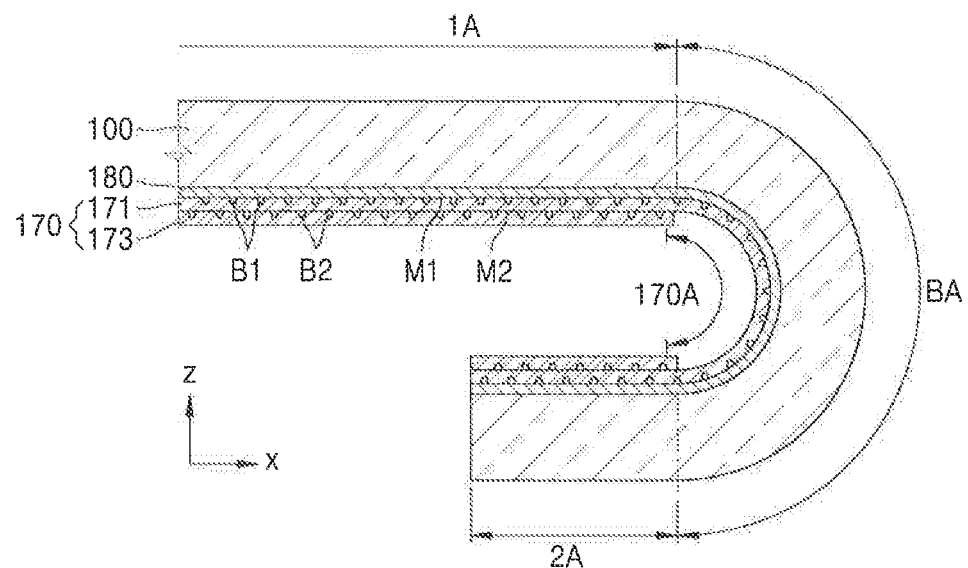
Figure 8:
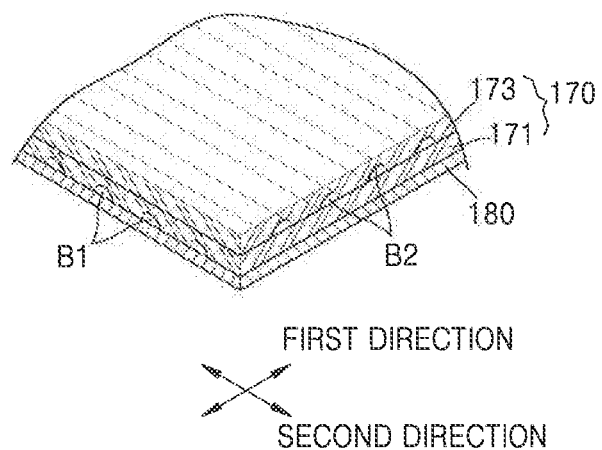

Referring to FIGS. 7 and 8, a display apparatus according to an exemplary embodiment of the present invention may include a protective film base 170 including a first protective film base layer 171 and a second protective film base layer 173. The first protective film base layer 171 and the second protective film base layer 173 may include a plurality of first cavities B1 and a plurality of second cavities B2, respectively, and may be sequentially stacked. The protective film base 170 may include one layer as in the above-described exemplary embodiments of the present invention, or may be formed by stacking two or more layers, as shown in FIG. 7. Although FIG. 7 shows a case where the protective film base 170 includes the first protective film base layer 171 and the second protective film base layer 173, the present invention is not limited thereto. For example, the protective film base 170 may include three or more layers. In this case, at least one of the first protective film base layer 171 and the second protective film base layer 173 may include an opening corresponding to a bending area BA. FIG. 7 shows a case where an opening is formed in the second protective film base layer 173. In the protective film base 170, the thickness of a stress concentration area 170A corresponding to the bending area BA may be adjusted by using an opening formed in the first protective film base layer 171 or the second protective film base layer 173. For example, a thickness of the first protective film base layer 171 and the second protective film base layer 173 in the peripheral area is greater than a thickness of the first protective film base layer 171 in the stress concentration area 170A. As a result, a tensile stress generated during bending may be reduced.

In addition, each of the first cavities B1 and each of the second cavities B2 may have the same size and/or shape, but are not limited thereto. Each of the first cavities B1 and each of the second cavities B2 may have different sizes and/or shapes, and positions at which the first cavities B1 are arranged may be different from positions at which the second cavities B2 are arranged.

The first protective film base layer 171 may include a first surface M1 in contact with an adhesive layer 180, and the second protective film base layer 173 may include a second surface M2 in contact with the first protective film base layer 171. The first surface M1 may include a plurality of first concave portions concaved in the direction of the first protective film base layer 171, and the first cavities B1 may be the plurality of first concave portions. For example, the first cavities B1 may be spaces between the first protective film base layer 171 and the adhesion layer 180. In addition, the second surface M2 may include a plurality of second concave portions concaved in the direction of the second protective film base layer 173, and the second cavities B2 may be the plurality of second concave portions. For example, the second cavities B2 may be spaces between the second protective film base layer 173 and the first protective film base layer 171. As shown in FIG. 7, the first cavities B1 and the second cavities B2 may all be spaces between concave grooves and an upper layer. In an exemplary embodiment of the present invention, one selected from each first cavity B1 and each second cavity B2 may be a space between a concave groove and the upper layer, and the other may include a bubble arranged therein and spaced apart from the first surface M1 or the second surface M2. In an exemplary embodiment of the present invention, both the first cavity B1 and the second cavity B2 may include a bubble arranged therein and spaced apart from the first surface M1 or the second surface M2.

Referring to FIG. 8, the first cavities B1 are formed to extend in the first direction in the first protective film base layer 171, and the second cavities B2 are formed to extend in the second direction in the film base layer 173. In other words, the first surface M1 may include a plurality of first concave portions that are concave in the direction of the first protective film base layer 171 and extend in the first direction. The first cavities B1 may be spaces between the plurality of first concave portions and the adhesive layer 180. In addition, the second surface M2 may include a plurality of second concave portions that are concave in the direction of the second protective film base layer 173 and extend in the second direction. The second cavities B2 may be spaces between the plurality of second concave portions and the first protective film base layer 171. In this case, the first direction and the second direction may be different from each other. In an exemplary embodiment of the present invention, as shown in FIG. 8, the first direction and the second direction may be orthogonal to each other, but the present invention is not limited thereto.

As described above, in the display apparatus according to exemplary embodiments of the present invention, a protective film arranged on a lower surface of a substrate may include a plurality of cavities to absorb external impacts or disperse directions of forces, and thus, it is possible to reduce an occurrence rate of a defect in the process of manufacturing the display apparatus and to reduce manufacturing costs.

According to exemplary embodiments of the present invention, it is possible to provide a display apparatus capable of reducing a manufacturing cost and an occurrence rate of a defect in the process of manufacturing the display apparatus.

While the present invention has been described with reference to exemplary embodiments thereof, it will be understood by those of ordinary skill in the art that various changes in form and details may be made thereto without departing from the spirit and scope of the present invention as defined by the following claims.

What is claimed is:

1. A display apparatus comprising:
    a flexible substrate having a bending area between a first area and a second area, wherein the flexible substrate is bent in the bending area;
    a display portion on an upper surface of the flexible substrate and positioned in the first area;
    a printed circuit board or an electronic chip on the upper surface of the flexible substrate and positioned in the second area; and
    a protective film on a lower surface of the flexible substrate and positioned in the second area, the protective film comprises a protective film base and an adhesive layer,
    wherein the protective film base comprises a plurality of cavities.

2. The display apparatus of claim 1, wherein the protective film base comprises a first surface in contact with the adhesive layer,
    wherein the plurality of cavities is inside the protective film base and spaced apart from the first surface.

3. The display apparatus of claim 1, wherein the protective film base comprises a first surface in contact with the adhesive layer,
    wherein the first surface comprises a plurality of concave portions protruded toward the protective film base, and the plurality of cavities comprises spaces between the plurality of concave portions and the adhesive layer.

4. The display apparatus of claim 1, wherein the protective film base comprises an opening corresponding to the bending area.

5. The display apparatus of claim 1, wherein the protective film base comprises a stress concentration area corresponding to the bending area,
    wherein a thickness of the stress concentration area is less than a thickness of an area near the stress concentration area.

6. The display apparatus of claim 1, wherein the protective film comprises:
    a first protective film base layer comprising a plurality of first cavities; and
    a second protective film base layer comprising a plurality of second cavities,
    wherein the first protective film base layer is stacked on the second protective film base layer.

7. The display apparatus of claim 6, wherein the adhesive layer is between the flexible substrate and the first protective film base layer,
    wherein the first protective film base layer comprises a first surface in contact with the adhesive layer, and
    the second protective film base layer comprises a second surface in contact with the first protective film base layer.

8. The display apparatus of claim 7, wherein the first surface of the first protective film base layer comprises a plurality of first concave portions protruded toward the first protective film base layer, and the plurality of first cavities comprises spaces between the plurality of first concave portions and the adhesive layer.

9. The display apparatus of claim 7, wherein the second surface of the second protective film base layer comprises a plurality of second concave portions protruded toward the second protective film base layer, and the plurality of second cavities comprises spaces between the plurality of second concave portions and the first protective film base layer.

10. The display apparatus of claim 7, wherein the first surface of the first protective film base layer comprises a plurality of first concave portions protruded toward the first protective film base layer and extending in a first direction, and the plurality of first cavities comprises spaces between the plurality of first concave portions and the adhesive layer, and wherein the second surface of the second protective film base layer comprises a plurality of second concave portions protruded toward the second protective film base layer and extending in a second direction, and the plurality of second cavities comprises spaces between the plurality of second concave portions and the first protective film base layer.

11. The display apparatus of claim 10, wherein the first direction and the second direction are different from each other.

12. The display apparatus of claim 7, wherein at least one of the first protective film base layer or the second protective film base layer comprises an opening corresponding to the bending area.

13. The display apparatus of claim 1, further comprising a cushion layer disposed on a portion of the protective film base corresponding to the display portion.

14. The display apparatus of claim 1, wherein the cavities include air.

15. A display apparatus comprising:
a flexible substrate including a bending area between a first area and a second area, wherein the flexible substrate is bent in the bending area;
a display portion on an upper surface of the flexible substrate and positioned in the first area;
a printed circuit board or an electronic chip on the upper surface of the flexible substrate and positioned in the second area; and
a protective film on a lower surface of the flexible substrate and positioned in the second area, the protective film comprises a protective film base and an adhesive layer,
wherein the protective film base comprises a plurality of cavities in the first area.

16. The display apparatus of claim 15, wherein a thickness of each of the cavities is smaller than a thickness of the protective film base.

17. The display apparatus of claim 15, wherein the cavities include air.

18. The display apparatus of claim 15, wherein the plurality of cavities overlap the bending area.

19. The display apparatus of claim 15, wherein the protective film base comprises an opening corresponding to the bending area.

20. The display apparatus of claim 15, wherein the protective film base comprises a stress concentration area corresponding to the bending area,
wherein a thickness of the stress concentration area is less than a thickness of an area near the stress concentration area.

* * * * *